United States Patent
Debbins et al.

(10) Patent No.: US 6,603,992 B1
(45) Date of Patent: Aug. 5, 2003

(54) METHOD AND SYSTEM FOR SYNCHRONIZING MAGNETIC RESONANCE IMAGE ACQUISITION TO THE ARRIVAL OF A SIGNAL-ENHANCING CONTRAST AGENT

(75) Inventors: Josef P. Debbins, Waukesha, WI (US); Frederick J. Frigo, Waukesha, WI (US); Michael R. Hartley, Pewaukee, WI (US); Jason A. Polzin, Lake Mills, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 175 days.

(21) Appl. No.: 09/691,691

(22) Filed: Oct. 18, 2000

(51) Int. Cl.[7] ............................................. A61B 5/055

(52) U.S. Cl. ................. 600/420; 600/428; 600/431; 600/413

(58) Field of Search ............................ 600/407, 410, 600/413, 420, 428, 431; 324/309

(56) References Cited

U.S. PATENT DOCUMENTS

| | | | | |
|---|---|---|---|---|
| 5,122,747 A | * | 6/1992 | Riederer et al. | 324/309 |
| 5,485,086 A | * | 1/1996 | Meyer et al. | 324/307 |
| 5,590,654 A | * | 1/1997 | Prince | 324/309 |
| 5,713,358 A | * | 2/1998 | Mistretta et al. | 324/306 |
| 5,892,358 A | * | 4/1999 | King | 324/307 |
| 5,912,557 A | | 6/1999 | Wilman et al. | |
| 6,195,579 B1 | * | 2/2001 | Carroll et al. | 324/306 |
| 6,198,283 B1 | | 3/2001 | Foo et al. | |
| 6,201,986 B1 | * | 3/2001 | Riederer et al. | 600/419 |
| 6,233,475 B1 | * | 5/2001 | Kim et al. | 324/309 |

OTHER PUBLICATIONS http://www.radinfonet.com/cme/mistretta/traveler.htm Mistretta CA., "A Traveler's Guide to K–Space" (Mar.–1998).*

"Spin Warp NMR Imaging and Applications to Human Whole–Body Imaging"; 6–pg. document; by W. A. Edelstein et al., Physics in Medicine and Biology, vol. 25, pp. 751–756 (1980).

"Carotid Arteries: Maximizing Arterial to Venous Contrast in Fluoroscopically Triggered Contrast–Enhanced MR Angiography with Elliptic Centric View Ordering"; Huston III, M.D. et al.; Applied Radiology Supplement, pp. 21–30; (Mar. 2000).

(List continued on next page.)

*Primary Examiner*—Marvin M. Lateef
*Assistant Examiner*—Barry Pass
(74) *Attorney, Agent, or Firm*—Foley & Lardner; Peter J. Vogel; Michael A. Della Penna (57) ABSTRACT

A method of synchronizing initiation of a magnetic resonance image (MRI) acquisition to the arrival of a contrast agent in a structure of interest, such as an artery, includes repeatedly performing a first MRI scan until the first MRI scan indicates that the contrast agent has arrived. The first MRI scan acquires a three-dimensional MRI data set from the structure of interest. Preferably, the first MRI scan is a partial MRI scan that produces a low resolution image. Once the first MRI scan indicates that the contrast agent has arrived in the structure of interest, a second MRI scan is performed that acquires a second three-dimensional MRI data set from the structure of interest. The second MRI scan is preferably a full MRI scan that produces a full fidelity image. The manner of data acquisition is advantageously the same for both the first MRI scan and the second MRI scan.

18 Claims, 5 Drawing Sheets

OTHER PUBLICATIONS

"Arterial Phase Carotid and Vertebral Artery Imaging in 3D Contrast–Enhanced MR Angiography by Combining Fluoroscopic Triggering with an Elliptical Centric Acquisition Order"; Wilman et al.; Magnetic Resonance in Medicine; vol. 40, No. 1, pp. 24–35 (Jul. 1998).

"Dynamic k–Space Filling for Bolus Chase 3D MR Digital Subtraction Angiography"; Lee et al.; Magnetic Resonance in Medicine; vol. 40, No. 1, pp. 99–104; (Jul. 1998).

"Fluoroscopically Triggered Contrast–enhanced Three–dimensional MR Angiography with Elliptical Centric View Order: Application to the Renal Arteries"; Wilman, Ph.D. et al.; Radiology; vol. 205, No. 1, pp. 137–146 (Oct. 1997).

"A Monitoring, Feedback, and Triggering System for Reproducible Breath–Hold MR Imaging"; Liu et al.; Magnetic Resonance in Medicine; vol. 30, No. 4, pp. 507–511 (Oct. 1993).

* cited by examiner

METHOD AND SYSTEM FOR SYNCHRONIZING MAGNETIC RESONANCE IMAGE ACQUISITION TO THE ARRIVAL OF A SIGNAL-ENHANCING CONTRAST AGENT

BACKGROUND OF THE INVENTION

The field of the invention is magnetic resonance imaging (MRI) methods and systems. More particularly, the invention relates to a method and system for synchronizing the initiation of an MRI data acquisition to the arrival of a signal-enhancing contrast agent.

Magnetic resonance imaging is commonly employed for a variety of imaging applications including medical imaging. When a substance such as human tissue is subjected to a uniform magnetic field (polarizing field $B_z$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_1$, which is rotating, or spinning, in the x-y plane at the Larmor frequency. The degree to which the net magnetic moment $M_1$ is tipped, and hence the magnitude of the net transverse magnetic moment $M_1$ depends primarily on the length of time and the magnitude of the applied excitation field $B_1$. A signal is emitted by the excited spins, and after the excitation signal $B_1$ is terminated, this signal may be received and processed to form an image.

One particular type of MRI measurements which are known as "pulsed MRI measurements" are divided into a period of excitation and a period of signal emission. Such measurements are performed in a cyclic manner in which the MRI measurement is repeated many times to accumulate different data during each cycle or to make the same measurement at different locations in the subject.

When utilizing MRI to produce images, a technique is employed to obtain MRI signals from specific locations in the subject. Typically, the region which is to be imaged is scanned by a sequence of MRI measurement cycles which vary according to the particular localization method being used. The resulting set of received MRI signals are digitized and processed to reconstruct the image using one of many well known reconstruction techniques. To perform such a scan, it is, of course, necessary to elicit MRI signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each MRI cycle, the spatial distribution of spin excitation can be controlled and the location of the resulting MRI signals can be identified.

MRI data for constructing images can be collected using one of many available techniques, such as multiple angle projection reconstruction and Fourier transform (FT). Typically, such techniques comprise a pulse sequence made up of a plurality of sequentially implemented views. Each view may include one or more MRI experiments, each of which comprises at least an RF excitation pulse and a magnetic field gradient pulse to encode spatial information into the resulting MRI signal, as well as a data acquisition window.

The preferred embodiments of the invention will be described in detail with reference to a variant of the well known FT technique, which is frequently referred to as "spin-warp". The spin-warp technique is discussed in an article entitled "Spin Warp NMR Imaging and Applications to Human Whole-Body Imaging" by W. A. Edelstein et al., Physics in Medicine and Biology. Vol. 25, pp. 751–756 (1980).

The spin-warp technique employs a variable amplitude phase encoding magnetic field gradient pulse prior to the acquisition of MRI spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a read-out magnetic field gradient ($G_x$) in a direction orthogonal to the phase encoding direction. The read-out gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of MRI data from which an entire image can be reconstructed.

The use of three-dimensional versions of the spin-warp method (3DFT) is finding wider use in clinical applications. In the 3DFT implementation, spatial information is encoded in two directions by applying phase encoding gradients along both directions and acquiring the MRI signal in the presence of a readout gradient along the third direction. According to one type of 3DFT scan, one of the phase encoding gradients (e.g. $G_y$) is stepped through all its values, and for each $G_y$ step, the other phase encoding gradient (e.g. $G_z$) is stepped through all its values. It has been found, however, that this scan technique can be problematic when it is important to initiate the scan sequence at a particular instant, for example, when a contrast agent is used.

During magnetic resonance imaging examinations, such as magnetic resonance angiography examinations, it is often useful to employ an exogenous, intravenously contrast agent to enhance details of the vasculature of interest. In particular, the arterial segments are usually of most interest. The contrast agent is typically used to shorten the longitudinal relaxation time for $T_1$ weighted images, thus greatly enhancing the signal intensity of the vasculature through which the contrast agent has perfused. In such studies, the highest quality image data is acquired when the contrast agent initially passes through the vasculature of interest and the image data deteriorates as the contrast agent begins to exit the structure of interest. For example, when imaging arteries, the image data deteriorates when the contrast agent begins to exit the arteries and enter the veins, because undesirable contrast enhancement in the veins obscures the arteries. Since 3DFT scans require considerable time to acquire all the phase encoding views needed for an image reconstruction, at least some of the MRI data is acquired under less than ideal circumstances, for example, during undesirable veinous enhancement.

To address this problem, U.S. Pat. No. 5,122,747 describes a scan technique commonly known as centric view ordering or centric encoding. Centric encoding scans ($k_y$, $k_z$) space in a spiral pattern starting at the center (or origin) of ($k_y$, $k_z$) space ($k_y=0$, $k_z=0$) and working outward. Since the central views contain the majority of structural information about the object, these central views can be positioned to be acquired at the optimal moment during the procedure and the peripheral views are acquired later. Equal y-axis and z-axis fields of view are assumed and hence the spacings $\Delta k_y$ and $\Delta k_z$ between samples are equal. Because of this equal spacing, the sampling path is a square spiral from which this phase encoding scheme takes its name. U.S. Pat. No. 5,912,557 describes a related scan technique commonly known as elliptic centric encoding. This technique can be used in situations when the fields of view along the two phase encoding axes are significantly different. According to this technique, each $(k_y, k_z)$ space sample point is ranked according to its distance from the origin of $(k_y, k_z)$ space. The closer points are ranked higher and appear earlier on the ordered list. The MRI data is then acquired in an order that is determined by this list, resulting in a sampling path that is an elliptic spiral from which this phase encoding scheme takes its name. In the simplified case where the fields of view are the same, elliptic centric encoding yields a sample path that is the same as that yielded by ordinary or square centric encoding.

Although these techniques have proven to be extremely useful, it is still desirable to accurately synchronize initiation of the centric data acquisition to the arrival of the contrast agent. If the data acquisition begins too soon, then the initial image data has a poor signal-to-noise ratio due to the contrast agent not yet having arrived at the structure of interest. If the data acquisition begins too late, then the image data has a poor signal-to-noise ratio due to a reduction in the concentration and effectiveness of the contrast agent as the contrast agent passes out of the structure of interest. Thus, if the centric data acquisition is started too early or too late relative to the arrival time of the contrast agent, the examination may not show the desired results, namely, signal enhancement of the structure of interest. Additionally, if the scan is started too late, then the contrast agent begins passing into other tissues or structures (e.g., veins), and the other tissues or structures become more prominent in the resulting image thereby corrupting the imaging of the arterial vasculature. Typically it is desirable to capture image data from only the structure of interest, because the presence of additional structure in the displayed image clutters the image and makes viewing the structure of interest more difficult.

SUMMARY OF THE INVENTION

In an exemplary embodiment of the invention, a method of synchronizing initiation of a magnetic resonance image (MRI) acquisition to the arrival of a contrast agent in a structure of interest comprises performing a first MRI scan that acquires a first three-dimensional MRI data set from the structure of interest. This step is repeated at least until the first MRI scan indicates that the contrast agent has arrived in the structure of interest. The method also comprises performing a second MRI scan that acquires a second three-dimensional MRI data set from the structure of interest, this step being initiated based on when the first MRI scan indicates that the contrast agent has arrived in the structure of interest.

In another exemplary embodiment of the invention, a method of synchronizing initiation of a magnetic resonance image acquisition to the arrival of a contrast agent in a structure of interest comprises repetitively performing a partial MRI scan. This step includes performing a first plurality of MRI pulse sequences that acquires sample MRI data for a first three-dimensional MRI data set. The method also comprises terminating the repetitively performing step and completing a full MRI scan after the partial MRI scan indicates that the contrast agent has arrived in the structure of interest. This step includes performing a second plurality of MRI pulse sequences that acquire sample MRI data for a second three-dimensional MRI data set.

Advantageously, the preferred embodiments makes it possible to accurately synchronize MRI image acquisition to the arrival of a contrast agent at the structure of interest. As a result, image quality of the structure of interest is enhanced, while the undesirable presence of unrelated structure in the acquired image is simultaneously minimized. Additionally, exam efficiency is maximized because only a single imaging procedure is required. Once the contrast agent is detected, it is possible to switch from a partial acquisition mode used to detect the contrast agent to a complete acquisition mode used for full fidelity 3D imaging. The manner of data acquisition is the same for both modes, thereby allowing both contrast agent detection and full fidelity 3D image acquisition to occur in a single imaging procedure.

DESCRIPTION OF THE PREFERRED EMBODIMENT

Figure 1:
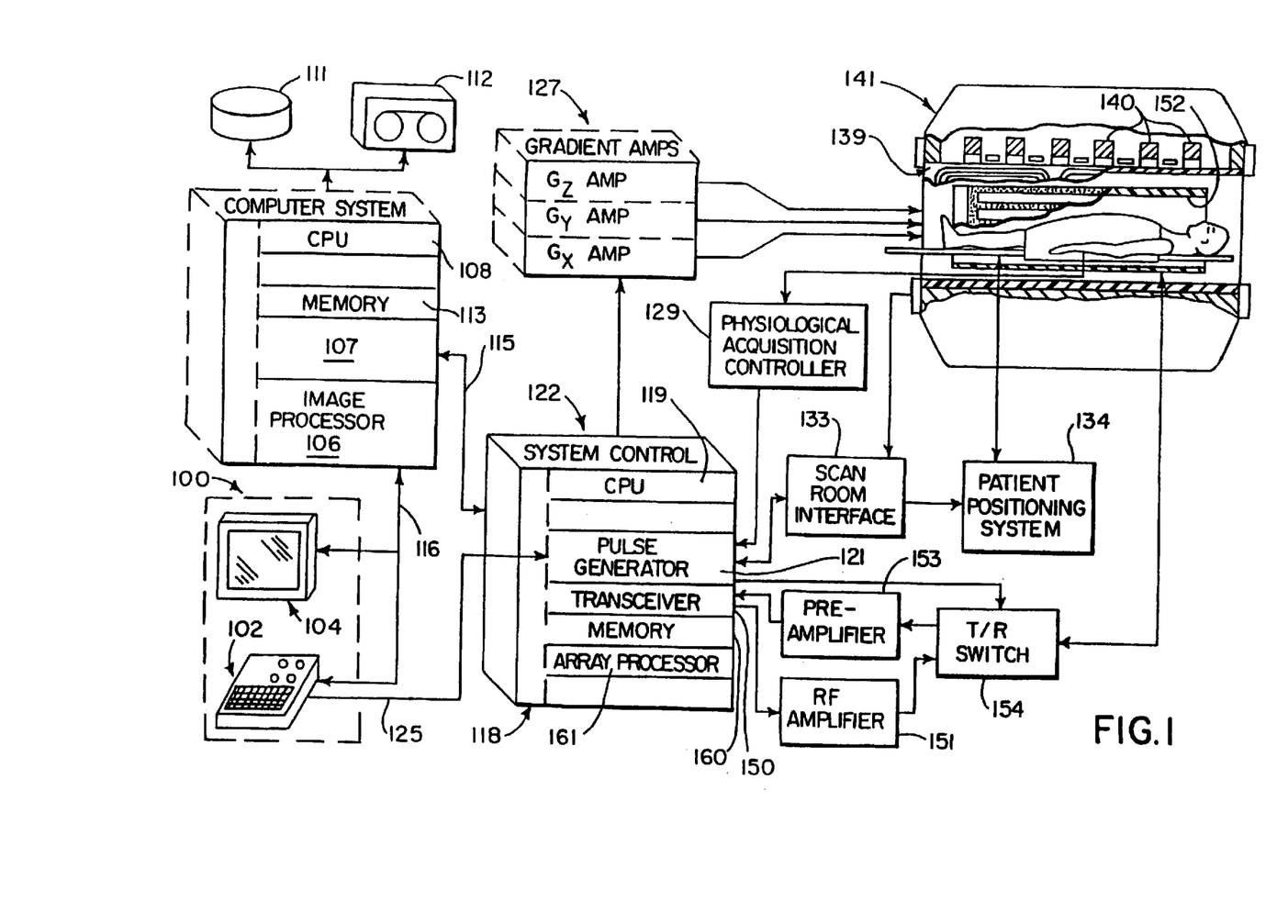
FIG. 1 is a block diagram of an MRI system which employs a preferred embodiment of the present invention.

Referring first to FIG. 1, there is shown the major components of a preferred MRI system which incorporates a preferred embodiment of the present invention. The operation of the system is controlled from an operator console 100 which includes a control panel 102 and a display 104. The control panel 102 includes one or more operator input devices such as a keyboard, mouse, trackball, joystick, light wand, touch sensitive area of the display 104, voice control device, and/or other input devices. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a non-volatile (e.g., magnetic or optical media) storage device 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a communication link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and an RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified MRI signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The MRI signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the non-volatile storage device 112, or it may be further processed by the image processor 106 and conveyed to the operator console 100 and presented on the display 104.

Figure 2:
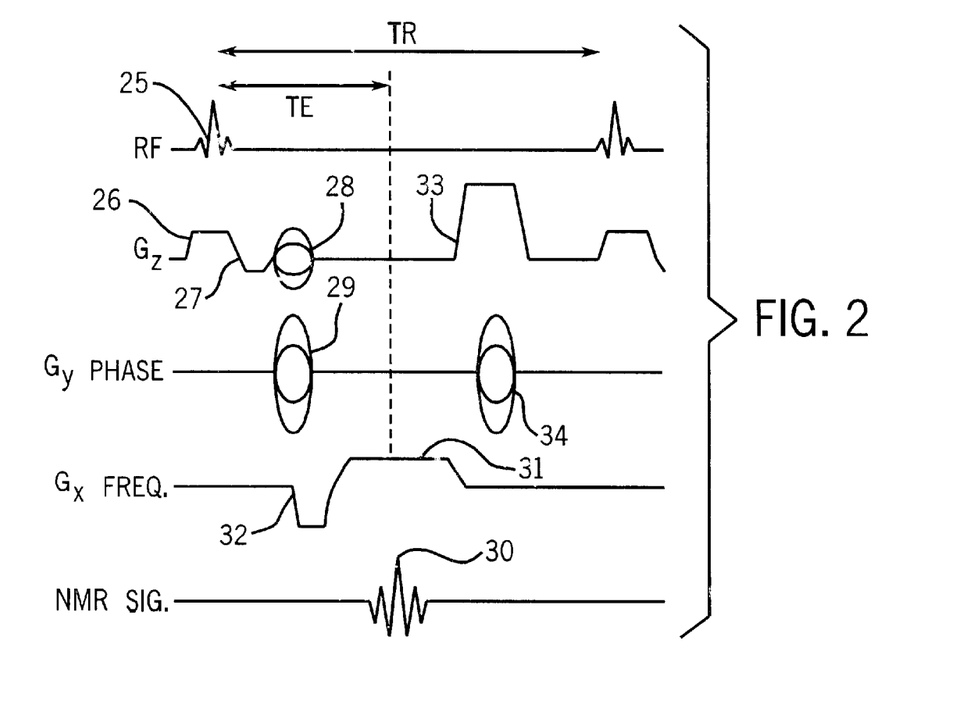
FIG. 2 is a graphic representation of a 3DFT pulse sequence employed by the MRI system of FIG. 1.

The MRI system of FIG. 1 performs a series of pulse sequences to collect sufficient MRI data to reconstruct an image. Referring particularly to FIG. 2, an exemplary pulse sequence for conducting a 3DFT MRI scan is shown. The pulse sequence commences by the selective excitation of the entire region of interest with an RF excitation pulse 25 in the presence of a slab select $G_z$ gradient pulse 26. The frequency content of the excitation pulse 25 and the amplitude of the slab select $G_z$ pulse 26 are selected to produce transverse magnetization in the region which is the subject of the 3D scan. A negative $G_z$ pulse 27 is then produced to rephase the spins in preparation for the phase encoding and readout.

Phase encoding is performed along two axes for 3D scanning: the z-axis and the y-axis. The z-axis encoding is accomplished by applying a $G_z$ phase encoding pulse 28 and the y-axis encoding is accomplished by applying a $G_y$ phase encoding pulse 29. As is well-known to those skilled in the art, the magnitude of the phase encoding pulses 28 and 29 are stepped through a series of positive and negative values during the scan, but each is set to one value during each pulse sequence. As is well-known in the art, the magnitude of a phase encoding gradient pulse is determined by the integral of its amplitude over its duration (i.e. its area). In most pulse sequences the duration is kept constant and the phase encoding pulse magnitude is stepped through its values by changing its amplitude.

After phase encoding the transverse magnetization, the MRI signal 30 is read-out in the presence of a $G_x$ read-out gradient 31. This read-out is preceded by a negative $G_x$ gradient pulse 32 to produce the gradient refocused MRI echo signal 30 in the usual fashion. The 3DFT pulse sequence is then concluded by the application of a large $G_z$ spoiler gradient pulse 33 and a $G_y$ rewinder gradient pulse 34 to prepare the magnetization for the next pulse sequence which follows immediately. As is known to those skilled in the art, the spoiler pulse 33 dephases transverse magnetization and the rewinder pulse 34 refocuses transverse magnetization along the y-axis in preparation for the next pulse sequence. The rewinder pulse 34 is equal in magnitude, but opposite in polarity with the $G_y$ phase encoding pulse 29.

The acquisition of data in 3DFT scanning can be considered sampling of a three-dimensional "Fourier space" or "k-space". Two of the dimensions, $k_y$ and $k_z$, are sampled by applying different phase encoding gradients $G_y$ and $G_z$ during each pulse sequence of the scan, and each acquired MRI signal contains a predetermined number (e.g., 256) samples along a line in the $k_x$ direction. The pulse sequence is repeated for as many repetitions as are necessary to sample all desired $k_y$ and $k_z$ values. For example, $k_y$ may assume 128 different values and $k_z$ may have 64 values. In this case the number of repetitions of the pulse sequence would be 128×64 or 8192 repetitions. If each view requires 4 msec, then the total scan time is 8192×4 msec or approximately 33 sec, which can be accomplished in a breath-hold to further reduce image corruption due to motion.

The preferred MRI system of FIG. 1 utilizes the elliptic centric encoding scan technique, described above, to determine the order in which the ($k_y$, $k_z$) values are sampled. Elliptic centric encoding utilizes the fact that for most objects the bulk of the signal power is contained in the samples taken near the origin of ($k_y$, $k_z$) space. (Herein, the term "($k_y$, $k_z$) space" is used to refer to a two-dimensional ($k_y$, $k_z$) plane of three dimensional k-space.) The k-space matrix is a frequency domain description of the image data, with samples near the origin ($k_y$=0, $k_z$=0) of ($k_y$, $k_z$) space receiving signal power from low frequency components of the image (locations in the image in which the image is slowly varying) and samples further away from the origin receiving signal power from high frequency components of the image (locations in the image where the image is quickly varying, such as the edges of structures or other fine details). The k-space data set can be Fourier transformed along the $k_x$, $k_y$ and $k_z$ directions to produce intensity values for an image in real (x,y,z) space.

Because the bulk of the signal power is contained in the samples taken near the origin of ($k_y$, $k_z$) space, it is desirable to acquire the samples near the origin as close to the beginning of the scan as possible. As previously noted, when a signal-enhancing contrast agent is utilized to increase the signal intensity of a structure of interest (e.g., a patient's arteries), the highest signal-to-noise ratio is achieved during the early stages of the contrast agent passing through the structure. Therefore, by starting the scan at the origin of ($k_y$, $k_z$) space, the bulk of image information is obtained when the signal-to-noise ratio is the highest.

As will now be described, the preferred embodiments of the invention also acquire samples near the origin of ($k_y$, $k_z$) space in order to facilitate synchronizing initiation of image acquisition to the arrival of a contrast agent in the structure of interest. As just noted, the samples near the origin of ($k_y$, $k_z$) space describe the low frequency components of the image and contain the bulk of the signal power. Because the high frequency components contain mainly edge information and other fine details, the samples near the origin contain enough information to generate a low resolution image of the structure of interest. Nevertheless, even though the structural details are not be ascertainable to the same extent as in a full fidelity image, it is possible to use the low resolution image to ascertain whether the injected contrast agent has arrived in the structure of interest. When the contrast agent arrives, the structure of interest as a whole will appear brighter in the image. Further, because only a portion of the ($k_y$, $k_z$) space samples are acquired during the low resolution scan, it is possible to repetitively acquire the samples and display the resultant low resolution images rapidly in real-time and/or to analyze the data automatically to detect the arrival of the contrast agent in the structure of interest. Thereafter, a full fidelity image acquisition can be performed.

Figure 3:
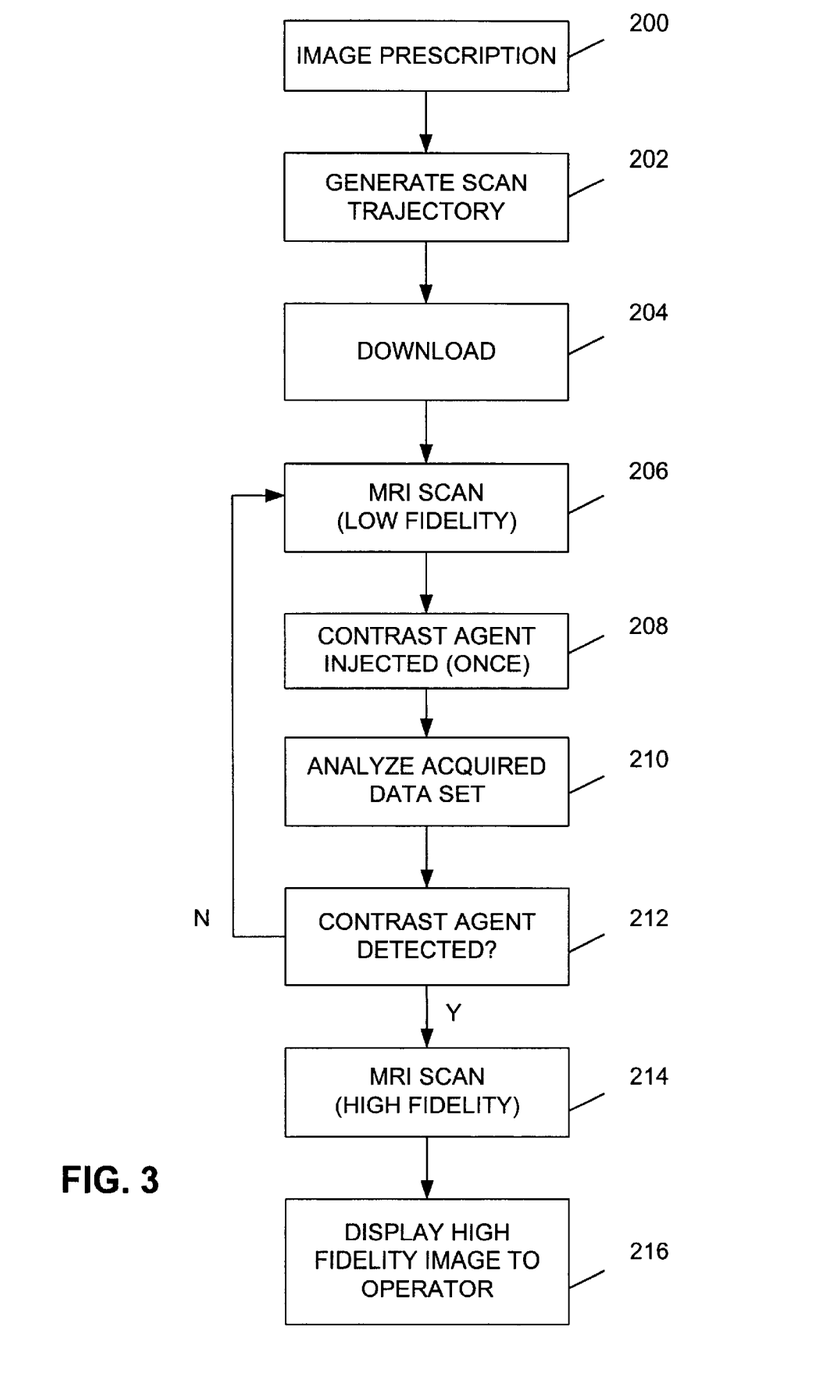
FIG. 3 is a flowchart of an image acquisition process utilized by the MRI system of FIG. 1.

Referring now to FIG. 3, a flowchart of a preferred image acquisition process employed by the system of FIG. 1 is illustrated. Although the process of FIG. 3 is described in connection with medical imaging, and in particular in connection with imaging arterial vasculature, it should be readily apparent that the process is equally applicable to imaging other structures of interest.

At step 200, the system receives an image prescription from the operator by way of the operator console 100. The image prescription includes various parameters that prescribe the image to be produced, for example, the fields of view along the phase encoding axes y and z as well as the resolution along these axes. These parameters are used to produce a two-dimensional array of k-space sample points.

At step 202, the ($k_y$, $k_z$) space sample points are ranked according to distance from the origin of ($k_y$, $k_z$) space. Based on the ranking, a ($k_y$, $k_z$) space acquisition or scan trajectory is determined such that points that are closer to the origin and are ranked higher appear earlier on the ordered list defining the scan trajectory.

Figure 4:
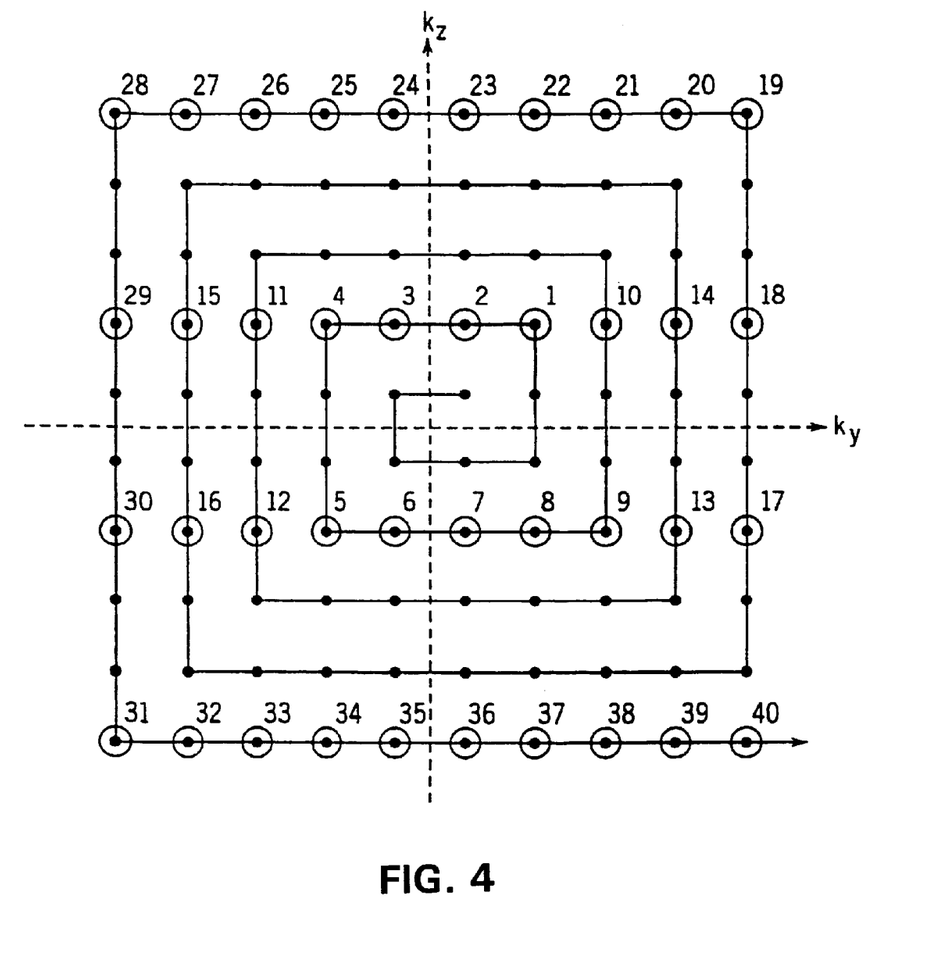
FIG. 4 is a graphic representation of an elliptic centric scan trajectory used by the process of FIG. 3.

These steps are shown in greater detail in FIG. 4, which shows a two-dimensional array of ($k_y$, $k_z$) space sample points as well as a scheme used to rank the sample points to produce an elliptic centric trajectory. The ranking scheme utilized in FIG. 4 employs a "master array" that includes enough sample points (shown as dots) to represent the highest resolution, largest field of view image that can be specified along the y and z axes. Any specific prescribed image will require a subset (shown as dots with circles) of the sample points in the master array. The spacing of the sample points in the master array (i.e., $\Delta k_y$ and $\Delta k_z$) is the same along both axes, and the sample points are ranked in a square spiral pattern starting at the origin of ($k_y$, $k_z$) space. The subset of the sample points required for a prescribed image are ranked by the order in which they are reached as one spirals outward in the master array, as shown by the solid lines. Thus, as each ($k_y$, $k_z$) space sample is located, it is assigned a rank determined by the rank of its corresponding point in the master array. The assigned ranks are then sorted to determine the proper view order. As an alternative, the distance from the ($k_y$, $k_z$) space origin to each sample point can be calculated, and the sample points can be ranked on the basis of their. respective distances from the origin of ($k_y$, $k_z$) space, with the sample point having the smallest distance being ranked first. These are simply two techniques of determining a scan trajectory. Numerous other techniques could also be employed, especially if centric encoding is not utilized.

At step 204, the information generated in steps 200–202 is downloaded from the operator console 100 to the system control 122. At step 206, the MRI system performs a first MRI scan that acquires a first 3D MRI data set from the structure of interest, Step 206 may be initiated, for example, in response to an operator input at the control panel 102. The MRI scan is performed using the magnet assembly 141 of the MRI system. In the preferred embodiment, during step 206, the MRI system performs a partial MRI scan in which less than all of the sample points required to produce the prescribed image are acquired, and the sample points are acquired in a region surrounding or near the origin of ($k_y$, $k_z$) space. In the most preferred embodiment, the MRI system starts at the origin of ($k_y$, $k_z$) space and begins acquiring data along an elliptic scan trajectory determined in step 202.

To acquire sample data for the first MRI scan, views are played out which each comprise an MRI pulse sequence. The MRI pulse sequences are performed for each sample point along the scan trajectory. Each MRI pulse sequence includes a first phase encoding gradient pulse having a magnitude which determines the location of the sample MRI data along one axis in the ($k_y$, $k_z$) plane of three-dimensional k-space, and a second phase encoding gradient pulse having a magnitude which determines the location of the sample MRI data along the other axis of the ($k_y$, $k_z$) plane of three-dimensional k-space. The locations of the sample MRI data along the first and second axes define the location of the sample MRI data on the two-dimensional ($k_y$, $k_z$) plane of three-dimensional k-space. The MRI pulse sequences are repeated to acquire sample MRI data from a plurality of locations along the scan trajectory on the ($k_y$, $k_z$) plane of three-dimensional k-space. If an elliptic trajectory is used for the first scan, then the magnitudes of the first and second phase encoding gradient pulses are stepped through values such that the location of successive samples forms an elliptic trajectory in the ($k_y$, $k_z$) plane of three-dimensional k-space.

In practice, the number of ($k_y$, $k_z$) sample points acquired is preferably less than 1000 sample points, and even more preferably less than 250 sample points. Ideally, the number of the number of ($k_y$, $k_z$) should be in the range of about 20 to 60 sample points. As the number of sample points increases, the amount of information used to determine whether the contrast agent has arrived in the structure of interest increases (e.g., the amount of data available for automatic analysis increases, or the resolution of the low resolution images that can be displayed to the operator increases). However, the update rate of the acquired information decreases (e.g., the number of frames per second that can be displayed to the operator decreases).

At step 208, a contrast agent is injected. In general, a contrast agent is used to enhance contrast of image data acquired from the affected tissue. Typically, a contrast agent operates by shortening the longitudinal relaxation constant of tissues in the structure of interest in order to enhance the signal intensity acquired from the affected tissue, as previously described. The contrast agent may, for example, be a bound gadolinium chelate.

For simplicity, step 208 is shown as being within the repetitive process loop defined by steps 206–212. In practice, however, step 208 is typically only performed once. Thus, the low fidelity scan step 206 is initiated and the contrast agent is injected at step 208 only after some time has passed (e.g., after the clinician has ensured that the patient is properly positioned, typically after many repetitions of steps 206, 210 and 212 have already been performed). Thereafter, step 208 is not repeated. Initiating the low fidelity scan step 206 before the contrast agent is injected at step 206 facilitates operator viewing of the transient conditions associated with the contrast agent entering the structure of interest.

Figure 5:
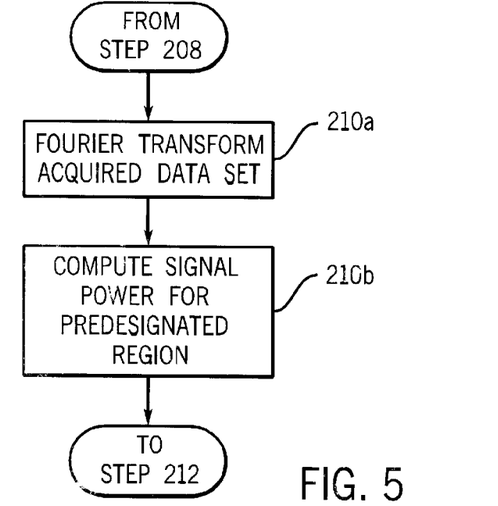
FIG. 5 is a flowchart of a data analysis step in the process of FIG. 3 shown in greater detail.

The sample MRI data that is acquired in step 206 forms a data set that can then be used for analysis purposes to determine whether the contrast agent has arrived in the structure of interest. Thus, after a predetermined number of samples have been acquired, at step 210, the MRI system analyzes the acquired data set to determine whether the contrast agent has arrived at the structure of interest. There are a variety of algorithms that can be executed by a microprocessor of the computer system 107 and that can be used to detect whether the contrast agent has arrived at the structure of interest. For example, the signal power of the acquired data can be automatically computed to determine whether the signal power has exceeded a threshold level, indicating arrival of the contrast agent in the structure of interest. An algorithm of this type is shown in FIG. 5, which in practice may be implemented in a signal analysis routine of a computer program executed by the computer system 107. As show therein, at step 210a, the acquired data set is Fourier transformed along the $k_x$, $k_y$ and $k_z$ directions to produce intensity values for an image and real (x,y,z) space. At step 210b, the signal power for a pre-designated region is then computed and compared with a predetermined threshold level. For example, the control panel 102 may be used while the low resolution images are being displayed to receive user inputs that designate an entrance or other region in the structure of interest on the real-time images. As a result, when the k-space data is Fourier transformed to produce intensity values and real (x,y,z) space, the signal intensity (brightness) for the pixels in the designated region can be analyzed to determine signal power. Alternatively, it would also be possible to analyze the total image signal power by analyzing the raw (untransformed) data. As previously noted, the contrast agent has the effect of enhancing the signal intensity of data acquired from affected regions. Therefore, computing signal power provides an indication whether a contrast agent is present. Other schemes could also be used to analyze the acquired data set.

At step 212, the process branches depending on whether arrival of the contrast agent has been detected during step 210. Assuming the contrast agent has to been detected, then the process returns to step 206. Steps 206, 210 and 212 are repeated at least until the partial MRI scan indicates that the contrast agent has arrived in the structure of interest.

After the partial MRI scan indicates that the contrast agent has arrived in the structure of interest, steps 206, 210 and 212 are terminated and a full MRI scan is completed. Thus, at step 214, a full MRI scan that acquires a full three-dimensional MRI data set from the structure of interest. Step 214 is initiated based on when the partial MRI scan indicates that the contrast agent has arrived in the structure of interest. Preferably, image acquisition is synchronized to the arrival of the contrast agent such that step 214 is initiated immediately, however, applications can be envisioned where it would be desirable or necessary for the synchronization to involve a delay being interposed between when the contrast agent is detected and when the full scan is initiated, for example, if a non-centric encoding technique is utilized, or if a patient breath-hold is required.

The sample data is preferably acquired in the same manner as discussed above in connection with step 210, that is, using repetitive MRI pulse sequences with first and second phase encoding gradients. The magnitudes of the first and second phase encoding gradient pulses are stepped through values such that the location of successive samples forms a second elliptic trajectory in the two-dimensional ($k_y$, $k_z$) space, in the same manner as discussed above in connection with step 206.

In the preferred embodiment, the elliptic scan trajectory used in step 206 and the elliptic scan trajectory used in step 214 both start at the origin and overlap as the scan proceeds into ($k_y$, $k_z$) space, with the primary difference being that the elliptic trajectory used in step 214 continues further out into ($k_y$, $k_z$) space. The sample points of the data set acquired in step 206 are a subset of the sample points of the data set acquired in step 214. Upon detection of a contrast agent in the structure of interest, the analysis in step 210 causes the MRI scan to switch from a partial acquisition mode of operation in which a partial set of three-dimensional data is acquired to a full acquisition mode of operation in which a full set of three-dimensional data is acquired and used to produce a full fidelity image set. However, because the sample points which are further out into ($k_y$, $k_z$) space are not acquired during the scan of step 206, it is seen that the locations of the sample MRI data for the partial data set acquired at step 206 are, on average, closer to the origin of ($k_y$, $k_z$) space than locations of the sample MRI data for the full data set acquired at step 214.

At step 214, the trajectory may simply continue along its path or, alternatively, the trajectory may restart. Preferably, a new scan sequence is initiated to avoid the processing time associated with performing the threshold detection introducing undesirable time delays in the acquired data. In general, it is necessary to acquire the data in a smoothly timed fashion. On the other hand, it would also be possible to complete the full scan in step 214 using at least some data that is acquired before the contrast agent is detected (i.e., such that the trajectory simply continues along its existing path).

At step 216, after the full image acquisition is complete, a full fidelity image of the structure of interest is displayed to the operator. The full fidelity image is generated based on the second data set acquired during step 214. In order to display the full fidelity image, the k-space data set is Fourier transformed along the $k_x$, $k_y$ and $k_z$ directions to a produce source image in real (x,y,z) space. Additionally, a maximum intensity projection (MIP) algorithm is typically performed to convert the three-dimensional data to two-dimensional data suitable for viewing. The MIP algorithm takes into account the desired orientation from which the operator desires to view the structure of interest. Based on this orientation, the MIP algorithm uses imaginary rays to select the brightest pixel from the travel path of the imaginary rays through the structure of interest, such that the brightest pixels are displayed in a two-dimensional format.

Figure 6:
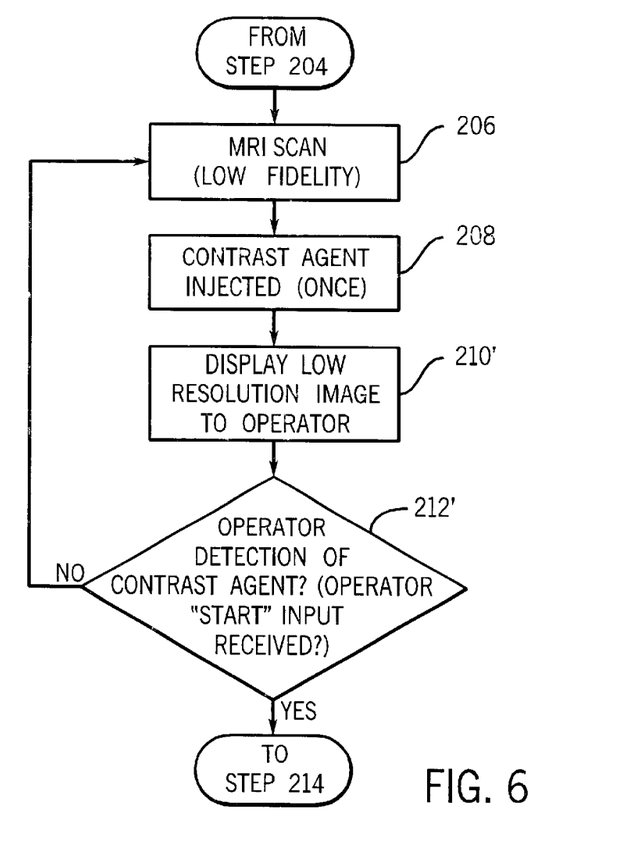
FIG. 6 is a flowchart of an alternative implementation of a portion of the process of FIG. 3.

Referring to FIG. 6, FIG. 6 shows an alternative implementation of steps 206–212, in which the initiation of the full image acquisition is caused manually. The process of FIG. 6 may be provided to meet the needs of more experienced operators that wish to retain a greater amount of control over the acquisition process.

Steps 206 and 208 are the same as described in connection with FIG. 3. At step 210', a low resolution image of the structure of interest is displayed to the operator using the display 104. The image is generated based on the data set acquired during step 206, and is referred to as a "low resolution" image because it has a resolution which is less than that of the fmal image displayed to the operator (sometimes referred to herein as a "full fidelity" image). The low resolution image is a two-dimensional image that is generated using the three-dimensional data set as an input to the MIP algorithm discussed above in connection with step 216.

At step 212', it is determined whether the operator has provided a "start" input using an input of the control panel 102. Initially, before the contrast agent arrives in the structure of interest, no signal enhancement occurs and the images displayed to the operator remain dim and the operator does nothing to cause initiation of the full image acquisition to occur. Therefore, at step 212', the MRI system does not initially receive an operator "start" input at the control panel 102.

As the process of steps 206–212' continues, low resolution images of the structure of interest are repeatedly displayed to the operator in real-time. The operator continues to view the low resolution images and, when the contrast agent begins to arrive at the structure of interest, there is an initial contrast enhancement that is perceptible to the operator in the form of the displayed images becoming brighter at the entry point of the contrast agent to the region of interest. When this occurs, the operator manually causes the full image acquisition to be initiated using an input device of the operator console 102 (e.g., by pressing a start button on a touch sensitive display). In this case, the structure of the MRI system that is used to detect arrival of the contrast agent is the input device on the control panel 102 that is activated by the operator in response to an increase in the brightness of the displayed images.

In this way, steps 206–212' are repeated at least until the scan performed in step 206 indicates to the operator that the contrast agent has arrived in the structure of interest. Thereafter, the process proceeds to steps 214 and 216 in FIG. 3, where a full scan is performed and a full fidelity image is displayed to the operator.

What is claimed is:

1. A method of synchronizing initiation of a magnetic resonance image (MRI) acquisition to the arrival of a contrast agent in a structure of interest, comprising:
    performing a first MRI scan that acquires a first three-dimensional MRI data set from the structure of interest;
    repeating said first performing step at least until said first MRI scan indicates that the contrast agent has arrived in the structure of interest;
    displaying images of said structure of interest to an operator in real-time, said images being generated based on said first data sets acquired during said first performing step and said repeating step; and
    performing a second MRI scan that acquires a second three-dimensional MRI data set from the structure of interest, said second performing step being initiated based on when said first MRI scan indicates that the contrast agent has arrived in the structure of interest.

2. A method according to claim 1, further comprising:
    permitting the operator to manually cause said second performing step to be initiated based on when said displayed images indicate to the operator that said contrast agent has arrived in the structure of interest.

3. A method according to claim 2, wherein said images displayed to said operator are two-dimensional images created from three-dimensional source images.

4. A method according to claim 2, further comprising displaying an additional image of said structure of interest to the operator, said additional image being generated based on said second data set acquired during said second performing step, and wherein said images displayed in real-time have a lower resolution than said additional image.

5. A method according to claim 1, further comprising:
    analyzing the images of the structure of interest produced from said first data sets acquired during said first performing step and said repeating step, said analyzing step being performed automatically using a computer;
    initiating said second performing step based on said analyzing step.

6. A method according to claim 1, wherein sample points of said first data set are a subset of sample points of said second data set.

7. A method according to claim 1, wherein said first performing step comprises
    performing an MRI pulse sequence in an MRI system to acquire sample MRI data for said first data set, said MRI pulse sequence including a first phase encoding gradient pulse having a magnitude which determines the location of said sample MRI data along a first axis of a two-dimensional plane of a three-dimensional k-space, and a second phase encoding gradient pulse having a magnitude which determines the location of said sample MRI data along a second axis of said two-dimensional plane in said three-dimensional k-space, said locations of said sample MRI data along said first and second axes defining the location of said sample MRI data on said two-dimensional plane of said three-dimensional k-space; and
    repeating said MRI pulse sequence to acquire sample MRI data for said first data set from a plurality of locations on said two-dimensional plane of three-dimensional k-space.

8. A method according to claim 7, wherein said plurality of locations are in a region near an origin of said two-dimensional plane.

9. A method according to claim 7, wherein said second performing step comprises
    performing an MRI pulse sequence in an MRI system to acquire sample MRI data for said second data set, said second MRI pulse sequence including a first phase encoding gradient pulse having a magnitude which determines the location of the sample MRI data along said first axis of a two-dimensional plane of a three-dimensional k-space, and a second phase encoding gradient pulse having a magnitude which determines the location of the sample MRI data along said second axis of said two-dimensional plane of said three-dimensional k-space, said locations of said sample MRI data along said first and second axes defining the location of said sample MRI data on said two-dimensional plane of said three-dimensional k-space; and
    repeating said MRI pulse sequence to acquire sample MRI data for said second data set from a plurality of locations on said two-dimensional plane of three-dimensional k-space; and
    wherein the locations of said sample MRI data for said first data set are, on average, closer to a center of said two-dimensional plane than locations of said sample MRI data for said second data set.

10. A method according to claim 9 wherein, while performing said MRI pulse sequences to acquire said sample data for said first and second data sets, the magnitudes of said first and second phase encoding gradient pulses are stepped through values such that the location of successive samples form an elliptic trajectory on said two-dimensional plane of said three-dimensional k-space for each of said first and second MRI scans.

11. A method according to claim 10 wherein, on said two-dimensional plane, said elliptic trajectory for said first MRI scan is the same as a portion of said elliptic trajectory for said second MRI scan.

12. A method of synchronizing initiation of a magnetic resonance image acquisition to the arrival of a contrast agent in a structure of interest, comprising:

repetitively performing a partial MRI scan, including performing a first plurality of MRI pulse sequences that acquire sample MRI data for a first three-dimensional MRI data set;

displaying a series of real time images of the structure of interest, said series of images being generated based on the first three-dimensional MRI data sets acquired during said first MRI scans; and terminating said repetitively performing step and completing a full MRI scan after said partial MRI scan indicates that the contrast agent has arrived in the structure of interest, including performing a second plurality of MRI pulse sequences that acquire sample MRI data for a second three-dimensional MRI data set.

13. A method according to claim 12, wherein each of said first and second plurality of MRI pulse sequences include a first phase encoding gradient pulse having a magnitude which determines the location of said sample MRI data along a first axis of a two-dimensional plane of a three-dimensional k-space, and a second phase encoding gradient pulse having a magnitude which determines the location of said sample MRI data along a second axis of said two-dimensional plane of said three-dimensional k-space, said locations of said sample MRI data along said first and second axes defining the location of said sample MRI data on said two-dimensional plane of said three-dimensional k-space;

wherein, during said first MRI scan, the magnitudes of said first and second phase encoding gradient pulses are stepped through values such that the location of successive samples forms a first elliptic trajectory on said two-dimensional plane;

wherein, during said second MRI scan, the magnitudes of said first and second phase encoding gradient pulses are stepped through values such that the location of successive samples forms a second elliptic trajectory on said two-dimensional plane; and wherein the sample locations of said first MRI data set is a subset of the sample locations of said second MRI data set, such that said first elliptic trajectory and said second elliptic trajectory are overlapping, with said second elliptic trajectory including at least one sample location at a greater distance from a center of said two-dimensional plane than the sample locations of said first elliptic trajectory.

14. A method according to claim 12, wherein the series of real-time images are two-dimensional images generated based on three-dimensional source images produced from said first data sets acquired during said first MRI scans.

15. A magnetic resonance imaging (MRI) system comprising:

(A) means for performing a plurality of three-dimensional MRI scans each comprised of a series of three-dimensional pulse sequences in which two phase encoding gradients are stepped through values which produce MRI signals that sample a region surrounding a center of a two-dimensional plane defined by the two phase encoding gradients in a three-dimensional k-space, such that an area near said center is sampled initially during the scan and sampling continues at points further away from said center as said scan is performed;

(B) means for displaying images of the structure of interest in real-time, said images being generated based on said plurality of three-dimensional MRI scans;

(C) means for detecting arrival of a contrast agent in a structure of interest based on said plurality of three-dimensional MRI scans; and (D) means for causing said means for performing to switch from a first mode of operation to a second mode of operation upon detection of a contrast agent in the structure of interest, said first mode of operation being a partial acquisition mode of operation in which a partial set of three-dimensional data is acquired, and said second mode of operation being a full acquisition mode of operation in which a full set of three-dimensional data is acquired and used to produce a full fidelity image set.

16. A magnetic resonance imaging system according to claim 15, wherein said images are generated based on three-dimensional source images produced from said plurality of three-dimensional MRI transform scans.

17. A magnetic resonance imaging system according to claim 15, wherein said means for detecting comprises an operator input device, said operator input device being activated by an operator in response to said images displayed by said means for displaying.

18. A magnetic resonance imaging system according to claim 15, wherein said means for detecting comprises a microprocessor executing a signal analysis routine.

* * * * *